US012044715B2

(12) United States Patent
Stein et al.

(10) Patent No.: US 12,044,715 B2
(45) Date of Patent: Jul. 23, 2024

(54) WIRELESS INTEGRITY SENSING ACQUISITION MODULE

(71) Applicant: Analog Devices, Inc., Wilmington, MA (US)

(72) Inventors: Yosef Stein, Sharon, MA (US); Hazarathaiah Malepati, Farmington, CT (US); Armindo B. Chaves, Hudson, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/511,065

(22) Filed: Oct. 26, 2021

(65) Prior Publication Data

US 2022/0128609 A1  Apr. 28, 2022

Related U.S. Application Data

(60) Provisional application No. 63/106,346, filed on Oct. 27, 2020.

(51) Int. Cl.
*G01R 27/14* (2006.01)
*G01N 27/20* (2006.01)

(52) U.S. Cl.
CPC ............. *G01R 27/14* (2013.01); *G01N 27/20* (2013.01)

(58) Field of Classification Search
CPC ................................ G01R 27/14; G01N 27/20
See application file for complete search history.

(56) References Cited

U.S. PATENT DOCUMENTS

| 4,326,164 A | 4/1982 | Victor |
| 4,794,797 A * | 1/1989 | Ogawa ................. G01M 5/0091 |
| | | 73/862.68 |

(Continued)

FOREIGN PATENT DOCUMENTS

| CA | 2 864 817 A1 | 8/2013 |
| CN | 102037480 A | 4/2011 |

(Continued)

OTHER PUBLICATIONS

Invitation to Pay Additional Fees mailed Nov. 19, 2021 in connection with International Application No. PCT/US21/36993.

(Continued)

*Primary Examiner* — Feba Pothen
(74) *Attorney, Agent, or Firm* — Wolf, Greenfield & Sacks, P.C.

(57) ABSTRACT

Aspects of the present disclosure are directed to a measurement module for measurement of a multi-electrode resistive sensing element with improved noise performance and accuracy. In some embodiments, stimulation to the sensing element is provided by a current path that originates from a signal source, through a switch block, through a pair of terminals, and ending at a reference node such as ground. An analog-to-digital converter (ADC) is coupled directly to one or both of the terminals to digitize a voltage. The ADC is coupled to terminals on the sensing element to measure a sensed voltage signal before the sensed signal goes through the switch block. As a result, the measured voltage signal may be free of noise that could be picked up from passing through the switch block, and accuracy of the resistance measurements on the sensing element can be improved.

20 Claims, 13 Drawing Sheets

(56) References Cited

U.S. PATENT DOCUMENTS

| | | | |
|---|---|---|---|
| 5,834,942 A | 11/1998 | De Angelis | |
| 6,362,632 B1 | 3/2002 | Livingston | |
| 6,975,103 B1 | 12/2005 | Blom | |
| 7,244,500 B2 | 7/2007 | Watts et al. | |
| 7,286,210 B2 | 10/2007 | Pettit | |
| 7,398,184 B1 | 7/2008 | Chen | |
| 7,553,341 B2 | 6/2009 | Pan et al. | |
| 7,781,862 B2 | 8/2010 | Bertin et al. | |
| 7,881,679 B1 | 2/2011 | Faravash et al. | |
| 7,940,063 B2 | 5/2011 | Shimizu et al. | |
| 8,133,465 B2 | 3/2012 | Dai et al. | |
| 8,271,218 B2 | 9/2012 | Colinet et al. | |
| 8,378,757 B2 | 2/2013 | Shin et al. | |
| 8,451,124 B2 | 5/2013 | Lynch et al. | |
| 8,552,597 B2 | 10/2013 | Song et al. | |
| 8,766,775 B2 | 7/2014 | Farrell et al. | |
| 8,787,904 B1 | 7/2014 | Hayes et al. | |
| 8,830,037 B2 | 9/2014 | Burke | |
| 8,890,547 B2 | 11/2014 | Maharyta et al. | |
| 9,018,616 B2 | 4/2015 | Hanein et al. | |
| 9,091,657 B2 | 7/2015 | Kessler et al. | |
| 9,232,475 B2 | 1/2016 | Heinzelman et al. | |
| 9,256,327 B2 | 2/2016 | Salaverry et al. | |
| 9,268,441 B2 | 2/2016 | Walsh et al. | |
| 9,372,209 B2 | 6/2016 | Iwamoto | |
| 9,429,491 B2 | 8/2016 | Bemis et al. | |
| 9,480,163 B2 | 10/2016 | Kessler et al. | |
| 9,582,981 B2 | 2/2017 | Rokhsaz et al. | |
| 9,600,125 B2 | 3/2017 | Badaye et al. | |
| 9,608,698 B2 | 3/2017 | Sessink et al. | |
| 9,721,463 B2 | 8/2017 | Rowland et al. | |
| 9,921,705 B2 | 3/2018 | Shibata | |
| 10,062,831 B2 | 8/2018 | Hasan et al. | |
| 10,114,987 B2 | 10/2018 | Nikunen et al. | |
| 10,146,360 B2 | 12/2018 | Vandermeijden et al. | |
| 10,210,445 B2 | 2/2019 | Nikunen et al. | |
| 10,352,726 B2 | 7/2019 | Gidd et al. | |
| 10,429,483 B2 | 10/2019 | Qu et al. | |
| 10,502,676 B2 | 12/2019 | Kessler et al. | |
| 10,581,176 B2 | 3/2020 | Puchades et al. | |
| 10,831,323 B2 | 11/2020 | Bohannon et al. | |
| 10,939,379 B2 | 3/2021 | Quinlan et al. | |
| 10,944,162 B2 | 3/2021 | Stein | |
| 2002/0154029 A1 | 10/2002 | Watters et al. | |
| 2004/0178806 A1 | 9/2004 | Foreman et al. | |
| 2004/0239504 A1 | 12/2004 | Kalinin et al. | |
| 2005/0075800 A1* | 4/2005 | Batzinger | G01B 7/281 |
| | | | 702/35 |
| 2005/0140457 A1 | 6/2005 | Bellantoni | |
| 2005/0149807 A1 | 7/2005 | Xu | |
| 2005/0183492 A1 | 8/2005 | Rao et al. | |
| 2005/0269213 A1 | 12/2005 | Steimle et al. | |
| 2005/0284232 A1 | 12/2005 | Rice | |
| 2006/0014155 A1 | 1/2006 | Hamers et al. | |
| 2006/0162431 A1 | 7/2006 | Harris et al. | |
| 2007/0096565 A1 | 5/2007 | Breed | |
| 2007/0120572 A1 | 5/2007 | Chen et al. | |
| 2007/0126553 A1 | 7/2007 | Park et al. | |
| 2007/0159187 A1 | 7/2007 | Chen et al. | |
| 2008/0135614 A1 | 6/2008 | Werner et al. | |
| 2008/0202930 A1 | 8/2008 | Mett | |
| 2008/0204275 A1 | 8/2008 | Wavering et al. | |
| 2009/0039864 A1 | 2/2009 | Gordon | |
| 2009/0121872 A1 | 5/2009 | Lynch et al. | |
| 2009/0126471 A1 | 5/2009 | Fay et al. | |
| 2009/0157358 A1 | 6/2009 | Kim | |
| 2010/0008825 A1 | 1/2010 | Subramanyam | |
| 2010/0027596 A1 | 2/2010 | Bellaouar et al. | |
| 2010/0097273 A1 | 4/2010 | Biris et al. | |
| 2010/0161004 A1 | 6/2010 | Najafi et al. | |
| 2010/0178543 A1 | 7/2010 | Gruner et al. | |
| 2010/0201189 A1 | 8/2010 | Kirby et al. | |
| 2010/0320569 A1 | 12/2010 | Narita | |
| 2011/0001502 A1 | 1/2011 | Walker | |
| 2011/0012723 A1 | 1/2011 | Adamson et al. | |
| 2011/0101996 A1 | 5/2011 | Potyrailo | |
| 2011/0240621 A1 | 10/2011 | Kessler et al. | |
| 2011/0293218 A1 | 12/2011 | Pettit | |
| 2012/0038377 A1 | 2/2012 | Hamann et al. | |
| 2012/0055810 A1 | 3/2012 | Zhou | |
| 2012/0240667 A1 | 9/2012 | Geneste et al. | |
| 2012/0256492 A1 | 10/2012 | Song et al. | |
| 2012/0286804 A1 | 11/2012 | Kato et al. | |
| 2013/0070805 A1* | 3/2013 | Coln | G01K 7/186 |
| | | | 374/1 |
| 2013/0104665 A1 | 5/2013 | Biris et al. | |
| 2013/0210154 A1 | 8/2013 | Dieckhoff et al. | |
| 2013/0230429 A1 | 9/2013 | Naishadham et al. | |
| 2014/0126442 A1 | 5/2014 | Jafarian et al. | |
| 2014/0145826 A1 | 5/2014 | Conner | |
| 2014/0184249 A1 | 7/2014 | Saafi et al. | |
| 2014/0191768 A1 | 7/2014 | Engl | |
| 2014/0200538 A1 | 7/2014 | Euliano et al. | |
| 2014/0254445 A1 | 9/2014 | Heinzelman et al. | |
| 2014/0266025 A1 | 9/2014 | Jakubowski | |
| 2015/0239708 A1 | 8/2015 | Palazzola et al. | |
| 2015/0317896 A1 | 11/2015 | Planton et al. | |
| 2015/0330212 A1 | 11/2015 | Sassi et al. | |
| 2016/0007288 A1 | 1/2016 | Samardzija et al. | |
| 2016/0033403 A1 | 2/2016 | Packirisamy et al. | |
| 2016/0050757 A1 | 2/2016 | Diao et al. | |
| 2016/0196455 A1 | 7/2016 | Gudan et al. | |
| 2016/0238547 A1 | 8/2016 | Park et al. | |
| 2016/0254844 A1 | 9/2016 | Hull et al. | |
| 2016/0274001 A1 | 9/2016 | Parker et al. | |
| 2016/0302264 A1 | 10/2016 | Kessler et al. | |
| 2016/0337789 A1 | 11/2016 | Rokhsaz | |
| 2017/0019954 A1 | 1/2017 | Kessler et al. | |
| 2017/0168021 A1 | 6/2017 | Van Tooren et al. | |
| 2017/0214567 A1 | 7/2017 | Salkintzis et al. | |
| 2017/0227586 A1* | 8/2017 | Poletto | G01R 27/14 |
| 2017/0230916 A1 | 8/2017 | Stein et al. | |
| 2017/0237466 A1 | 8/2017 | Carr | |
| 2017/0331844 A1 | 11/2017 | Harrigan et al. | |
| 2017/0358854 A1 | 12/2017 | Stein | |
| 2018/0003615 A1 | 1/2018 | Kessler et al. | |
| 2018/0095001 A1 | 4/2018 | Sun et al. | |
| 2018/0139698 A1 | 5/2018 | Quinlan et al. | |
| 2018/0191451 A1 | 7/2018 | Lynch et al. | |
| 2018/0246200 A1 | 8/2018 | Goossen et al. | |
| 2019/0002120 A1 | 1/2019 | Vinson et al. | |
| 2019/0112072 A1 | 4/2019 | Abe et al. | |
| 2019/0113941 A1 | 4/2019 | Dubois et al. | |
| 2019/0193371 A1 | 6/2019 | Shinozaki et al. | |
| 2019/0243696 A1 | 8/2019 | Snyder | |
| 2019/0252919 A1 | 8/2019 | Ogawa et al. | |
| 2019/0294275 A1 | 9/2019 | Ko et al. | |
| 2020/0014354 A1 | 1/2020 | Luk et al. | |
| 2020/0016626 A1 | 1/2020 | Holmes | |
| 2020/0132431 A1* | 4/2020 | Anderson | G01L 1/20 |
| 2020/0189229 A1 | 6/2020 | Palmer et al. | |
| 2020/0235713 A1 | 7/2020 | Luk et al. | |
| 2020/0241670 A1 | 7/2020 | Abu Saude et al. | |
| 2020/0247562 A1 | 8/2020 | Stein | |
| 2020/0309674 A1 | 10/2020 | Wardle et al. | |
| 2020/0321787 A1 | 10/2020 | Miller | |
| 2021/0013747 A1 | 1/2021 | Wang et al. | |
| 2021/0083510 A1 | 3/2021 | Liu et al. | |
| 2021/0153128 A1 | 5/2021 | Quinlan et al. | |
| 2021/0314871 A1 | 10/2021 | Stein et al. | |
| 2021/0389265 A1 | 12/2021 | Stein et al. | |

FOREIGN PATENT DOCUMENTS

| | | | |
|---|---|---|---|
| CN | 102612638 A | 7/2012 | |
| CN | 102782625 B | 10/2016 | |
| CN | 103294299 B | 12/2016 | |
| CN | 107576690 A | 1/2018 | |
| CN | 105934733 B | 2/2019 | |
| EP | 1 968 429 B1 | 4/2013 | |
| EP | 2 789 992 A1 | 10/2014 | |
| EP | 2 985 925 A1 | 2/2016 | |
| EP | 3 190 421 A1 | 7/2017 | |
| EP | 3780048 A1 * | 2/2021 | G01R 27/02 |

(56) References Cited

FOREIGN PATENT DOCUMENTS

| JP | 6310011 B2 | 4/2018 |
|---|---|---|
| KR | 10-0839226 B1 | 6/2008 |
| WO | WO 2001/013087 A2 | 2/2001 |
| WO | WO 2006/137849 A1 | 12/2006 |
| WO | WO 2008/125878 A1 | 10/2008 |
| WO | WO 2017/214488 A1 | 12/2017 |
| WO | WO 2010/150009 A1 | 12/2019 |

OTHER PUBLICATIONS

International Search Report and Written Opinion mailed Feb. 4, 2022 in connection with International Application No. PCT/US21/36993.
International Search Report and Written Opinion mailed Mar. 4, 2022 in connection with International Application No. PCT/US21/56630.
Chiodarelli et al., Measuring the Electrical Resistivity and Contact Resistance of Vertical Carbon Nanotube Bundles for Application as Interconnects. Nanotechnology. Jan. 17, 2011; 22:085302 (7 Pages).
Lee et al., Formation of Low-Resistance Ohmic Contacts between Carbon Nanotube and Metal Electrodes by a Rapid Thermal Annealing Method. J. Phys. D: Appl. Phys. Jun. 1, 2000; 33:1953-1956.
Van Den Heever et al., Tactile Sensing using Force Sensing Resistors and a Super-Resolution Algorithm. IEEE Sensors Journal. Jan. 1, 2009; 9(1): 29-35.
Zhao et al., Decrease of Contact Resistance at the Interface of Carbon Nanotube/Electrode by Nanowelding. Electron. Mater. Lett. Oct. 12, 2016; 6 pages.
International Preliminary Report on Patentability mailed Oct. 13, 2022 in connection with International Application No. PCT/US2021/025379.
U.S. Appl. No. 17/346,049, filed Jun. 11, 2021, Stein.
International Search Report and Written Opinion mailed Sep. 25, 2017 in connection with International Application No. PCT/US2017/036719.
International Search Report and Written Opinion mailed Oct. 24, 2017 in connection with International Application No. PCT/US2017/040356.
International Preliminary Report on Patentability mailed Dec. 20, 2018 in connection with International Application No. PCT/US2017/036719.
International Preliminary Report on Patentability mailed Jan. 10, 2019 in connection with International Application No. PCT/US2017/040356.
International Search Report and Written Opinion mailed Jun. 21, 2021 in connection with International Application No. PCT/US2021/025379.
Invitation to Pay Additional Fees mailed Dec. 28, 2021 for International Application No. PCT/US2021/56630.
Kang et al., Structural Health Monitoring based on Electrical Impedance of a Carbon Nanotube Neuron. Key Engineering Materials. 2006;321-323:140-5.
Kang, Carbon Nanotube Smart Materials. Thesis submitted to the Division of Research and Advanced Studies of the University of Cincinnati. 2005; 170 pages.
Kessler, Structural Health Monitoring Capabilities. Metis Design Corporation. Powerpoint Presentation 2008, 42 pages.
Lazaro et al., A Passive Harmonic Tagfor Humidity Sensing. International Journal of Antennas and Propogation. Jul. 23, 2014; 2014 (670345): 11 pages.
Loh et al., Passive wireless sensing using SWNT-based multifunctional thin film patches. International Journal of Applied Electromagnetics and Mechanics. 2008; 28:87-94.
Lurz et al., Reader Architectures for Wireless Surface Acoustic Wave Sensors. Sensors. May 28, 2018; 18(1734):29 pages.
Lynch et al., A Summary Review of Wireless Sensors and Sensor Networks for Structural Health Monitoring. The Shock and Vibration Digest. Mar. 2006;38(2):91-128.
Mahbub et al., Electronic Sensor Interfaces With Wireless Telemetry. Intech. Advances in Bioengineering. 2015; Chapter 6:151-175.
Oh et al., A 116n W Multi-Band Wake-Up Receiver with 31-bit Correlator and Interference Rejection. Custom Integrated Circuits Conference (CICC), 2013 IEEE. 4 pages.
Rinaldi et al., Corrosion Sensor Development for Condition-Based Maintenance of Aircraft. International Journal of Aerospace Engineering. 2012; 2012:11 pages. Article IDS 684024.
Roberts et al., A 236nW-56.5dBm-Sensitivity Bluetooth Low-Energy Wakeup Receiver with Energy Harvesting in 65nm CMOS. 2016 IEEE International Solid-State Circuits Conference. Digest of Technical Papers. 2016; pp. 450-451.
Rocheleau et al., MEMS-Based Tunable Channel-Selecting Super-Regenerative RF Transceivers. Berkeley Sensor & Actuator Center. University of California. Prepublication Data Sep. 2015; 2 pages.
Sample et al., Design of an RFID-Based Battery-Free Programmable Sensing Platform. IEEE Transactions on Instrumentation and Measurement. Nov. 2008;57(11):2608-15.
PCT/US2021/056630, May 11, 2023, International Preliminary Report on Patentability.
International Preliminary Report on Patentability mailed May 11, 2023 in connection with International Application No. PCT/US2021/056630.
International Preliminary Report on Patentability mailed Dec. 22, 2022 in connection with International Application No. PCT/US2021/036993.

* cited by examiner

| Pair# | Measured Resistance |
|---|---|
| Pair1 | $R1 = R_L + R_A + R_M$ |
| Pair2 | $R2 = R_L + R_A + R_B + R_N$ |
| Pair3 | $R3 = R_M + R_B + R_C + R_X$ |
| Pair4 | $R4 = R_N + R_C + R_X$ |

FIG. 4B

| Pair # | Measured Resistance |
|---|---|
| Pair1 | $R1 = R_L + R_A + R_M$ |
| Pair2 | $R2 = R_L + R_A + R_B + R_N$ |
| Pair3 | $R3 = R_M + R_B + R_N$ |
| Pair4 | $R4 = R_M + R_B + R_C + R_X$ |
| Pair5 | $R5 = R_N + R_C + R_X$ |
| Pair6 | $R6 = R_N + R_C + R_D + R_Y$ |
| Pair7 | $R7 = R_X + R_D + R_Y$ |
| Pair8 | $R8 = R_X + R_D + R_E + R_Z$ |
| Pair9 | $R9 = R_Y + R_E + R_Z$ |

FIG. 5B

WIRELESS INTEGRITY SENSING ACQUISITION MODULE

CROSS-REFERENCE TO RELATED APPLICATIONS

This application claims the benefit of U.S. Provisional Application Ser. No. 63/106,346, filed on Oct. 27, 2020, and entitled "WIRELESS INTEGRITY SENSING ACQUISITION MODULE," which is hereby incorporated by reference herein in its entirety.

FIELD OF THE DISCLOSURE

The present application relates to sensors.

BACKGROUND

One or more states of a target material may change when the target material is exposed to certain environmental conditions. For example, a target material may be subject to corrosion when exposed to certain temperature, mechanical vibration, humidity or moisture conditions over a period of time, such that physical and chemical characteristics of the target material may change over the same period of time. A sensor apparatus may be used to monitor a state of the target material.

Sensors are devices that are sometimes used for sensing various environmental conditions or structural health conditions. Environmental or structural sensors sense a condition of interest and communicate in a wired or wireless fashion with a reader apparatus. Multiple sensors may be deployed to monitor multiple spatial locations of a structure or an environment, and these sensors may also be referred to as sensor nodes.

Sometimes a sensor communicates with a reader using a wireless transceiver and antennas included in the sensor. The sensor uses an external or battery-powered energy source to operate the transceiver and/or other components of the sensor.

SUMMARY OF THE DISCLOSURE

Aspects of the present disclosure are directed to a measurement module for measurement of a multi-electrode resistive sensing element with improved noise performance and accuracy. In some embodiments, stimulation to the sensing element is provided by a current path that originates from a signal source, through a switch block, through a pair of terminals, and ending at a reference node such as ground. An analog-to-digital converter (ADC) is coupled directly to one or both of the terminals to digitize a voltage. The ADC is coupled to terminals on the sensing element to measure a sensed voltage signal before the sensed signal goes through the switch block. As a result, the measured voltage signal may be free of noise that could be picked up from passing through the switch block, and accuracy of the resistance measurements on the sensing element can be improved.

According to some embodiments, an apparatus for measuring a resistance of a variable resistance sensor is provided. The variable resistance sensor has a plurality of terminals. The apparatus comprises a switch block configured to selectably couple a reference signal source to a first terminal of the plurality of terminals of the variable resistance sensor; and an analog-to-digital converter (ADC) coupled to the first terminal of the plurality of terminals and configured to digitize a voltage present at the first terminal of the plurality of terminals.

According to some embodiments, a sensing apparatus for measuring a parameter of a variable resistance sensor is provided. The variable resistance sensor has a plurality of terminals. The sensing apparatus comprises an analog-to-digital converter (ADC); a switch block; a reference signal source; and a current path between the reference signal source and a first terminal of the plurality of terminals of the sensor via the switch block. The current path continues to a reference voltage node via the switch block. The ADC is coupled to the first terminal and configured to digitize a voltage present at the first terminal.

According to some embodiments, a method to measure a parameter of a sensor is provided. The sensor has a plurality of terminals. The method comprises closing a first switch in a switch block such that a reference signal source is coupled with a first terminal of the plurality of terminals of the sensor; and digitizing, with an analog-to-digital converter (ADC), a voltage present at the first terminal in response to a reference voltage signal at the reference signal source.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear. In the drawings:

FIG. 4B is a table illustrating an exemplary method using four two-terminal resistance measurements to obtain a contact-resistance-independent resistance of a region of the resistive film, in accordance with some embodiments;

FIG. 5B is a table illustrating an exemplary method using four two-terminal resistance measurements to obtain a contact-resistance-independent resistance for several regions of the resistive film, in accordance with some embodiments;

DETAILED DESCRIPTION

Figure 1:
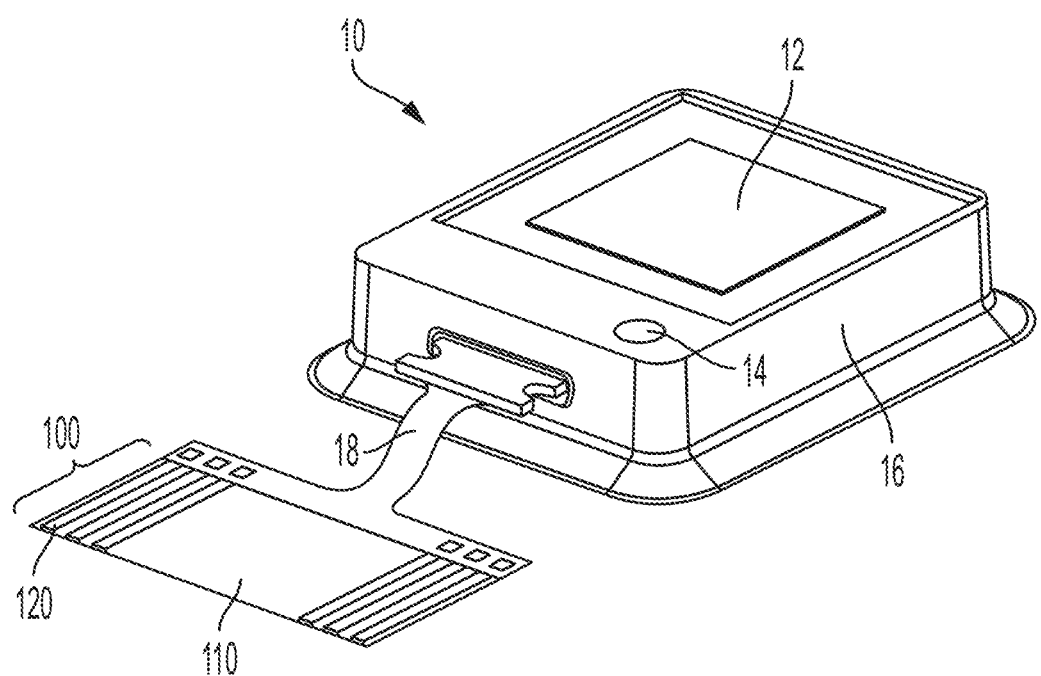
FIG. 1 is a schematic diagram of an exemplary sensor, in accordance with some embodiments.

In a passive resistive type sensor, an electrical resistance of a passive resistive sensing element such as a resistive film may be monitored to represents a parameter of interest in the target material. To measure electrical resistance of a resistive film, terminals may be formed to be in electrical contact with the resistive film, such as by deposition of conductive electrodes. A two-terminal resistance may be measured in between each pair of terminals.

Two-terminal resistance of a resistive film suffers from a non-zero contribution from the two serial contact resistance values at the terminal to film contacts, which renders the measured resistance larger than the actual resistance of the portion of resistive film between the two terminals. Moreover, resistance of a resistive film comprising composite polymers may be subject to undesirable drift effects from temperature or other environmental variations. It has been recognized that contacts to a resistive film can be made via multiple electrodes at a plurality of contact points on the resistive film, and a calibration scheme can be performed based on a combination of resistances measured at a plurality of electrode pairs to compensate for sensor background drift and to remove contact resistance. Some aspects of a self-calibrating, or self-compensating sensing element are described in U.S. Patent Application Ser. No. 63/038,551, filed on Jun. 12, 2020 and entitled "SELF-CALIBRATING POLYMER NANO COMPOSITE (PNC) SENSING ELEMENT," and in U.S. patent application Ser. No. 17/346,049, filed on Jun. 11, 2021 and entitled "SELF-CALIBRATING POLYMER NANO COMPOSITE (PNC) SENSING ELEMENT," the disclosure of which are hereby incorporated by reference in its entirety.

Aspects of the present disclosure are directed to a measurement module for measurement of resistances at a plurality of terminals on a resistive sensor with improved noise performance and accuracy. In some embodiments, stimulation to the resistive sensor is provided by a current path that originates from a signal source, through a switch block, through a pair of terminals, and ending at a reference node such as ground. An analog-to-digital converter (ADC) is coupled directly to one or both of the terminals to digitize a voltage. Because the ADC measures a voltage directly at the terminals and outside the switch block, the digitized voltage is a more accurate representation of voltage sensed on the resistive sensor that can be free of noise and resistive voltage drop contributions from within the switch block. As a result, more accurate resistance measurements on the resistive sensor can be achieved.

Some measurement modules include circuitry to apply stimulus signals to a resistive sensor, and to measure an electrical characteristics of the resistive sensor in response to the stimulus signal. A measurement module may include a multiplexed switch block (or a switch matrix, a switch bar) that is controlled to selectively couple one or more stimulus sources within the measurement module to one or more selected terminals of the resistive sensor. In this way, there is no need for a one-to-one correspondence for stimulus sources given a large number of terminals.

Some measurement modules may also include a ADC that converts one or more analog electrical signals to digital signals that can be communicated to a reader, for example by a communication module of the sensor.

In some embodiments, switches in a switch block are selectively controlled to close such that a reference signal source is coupled to a first terminal on a variable resistance sensor, thereby forming a current path that supplies a current that originates from the reference signal source, via the switch block, to the first terminal, through a portion of the variable resistance sensor contacted by the first terminal and a second terminal, out of the second terminal, and eventually sinks at a reference node such as ground. The reference node may be selectively coupled to the second terminal via switches in the switch block.

In such embodiments, the ADC is coupled to the first terminal to digitize a voltage present at the first terminal. The digitized voltage may be combined with the current in the current path to determine a resistance value of the portion of the variable resistance sensor between the first and second terminals. By measuring a voltage directly at the first terminal and out of the current path through the switch block, more accurate voltage measurement without contribution from the switch block can be achieved.

In some embodiments, the ADC may also digitize a voltage at the second terminal. The voltages at the first and second terminal may form a differential measurement to represent a voltage difference across the first and second terminals.

In some embodiments, the reference signal source is a voltage output of the ADC, although it is not a requirement and any suitable voltage or current source may act as the reference signal source.

In some embodiments, a reference resistor is provided between the reference signal source and the switch block. A voltage drop across the reference resistor may be measured, for example by coupling the ADC with the reference resistor, to represent the current in the current path.

The aspects and embodiments described above, as well as additional aspects and embodiments, are described further below. These aspects and/or embodiments may be used individually, all together, or in any combination of two or more, as the application is not limited in this respect.

FIG. 1 is a schematic diagram of an exemplary sensor, in accordance with some embodiments. FIG. 1 shows a sensor 10 that has a measurement module 16, a sensing element 100, a connector 18, and a sensing element 100. Measurement module 16 is coupled to sensing element 100 via connector 18, which may be a cable such as a flexible ribbon cable, while other suitable connectors that can provide electrical communication can also be used. Sensor 10 may also have one or more antennas 12 for transmitting and receiving power and data signals from an external device such as a reader. The measurement module 16 may include a housing, and an indicator 14 may be provided on an exterior of the housing to provide visual feedback to an operator. Indicator 14 may include for example one or more light emitting diodes (LEDs).

Sensing element 100 includes a resistive film 110 and a plurality of electrodes 120 in contact with the resistive film 120. The plurality of electrodes 120 form a plurality of electrical breakout points disposed on sensing element 100 that interface with connector 18. Electrodes 120 may be formed by, for example deposition of strips of metal such as Au or Cu on the surface of resistive film 110. In some embodiments, the resistive film may comprise polymer nano composite (PNC), and may be referred to as a PNC film. In a non-limiting example, a PNC film may comprise carbon nanotubes (CNT). In an exemplary PNC film, the CNT may be evenly dispersed through a volume of polymer, disposed in a sheet or film, while other forms of mixing CNT in the PNC film may also be used.

As shown in FIG. 1, electrodes 120 are arranged in a linear array on the resistive film 110, and has 6 electrodes. However, it should be appreciated that the FIG. 1 shows an illustrative example only, and in some embodiments, there may be less than 6 electrodes, such as 5 electrodes. In some embodiments, more than 6 electrodes may be used.

While not shown in FIG. 1, a non-conductive layer may be disposed on a bottom surface of the sensor, such as on a surface of the measurement module 16, and/or on the bottom surface of sensing element 100 to provide improved electrical isolation from and improved adhesion to a host material or structure that is being monitored by the sensor. A non-conductive layer may additionally or optionally disposed on a top surface of the sensor to provide improved electrical and contamination isolation from the surrounding environment.

Sensor 10 may be powered and interrogated wirelessly and used to sense a structural health condition of a structure as part of a Wireless Integrity Sensing platform (WISP). An example of a WISP is described in U.S. patent application Ser. No. 16/268,437, filed on Feb. 5, 2019 and entitled "INTEGRATED RF POWERED PLATFORM FOR STRUCTURE HEALTH MONITORING (SHM) OF AIRCRAFT USING NANOSTRUCTURED SENSING MATERIAL," and published as U.S. Pat. Pub. No. 2020/0247562 A1, the disclosure of which is hereby incorporated by reference in its entirety.

Figure 2A:
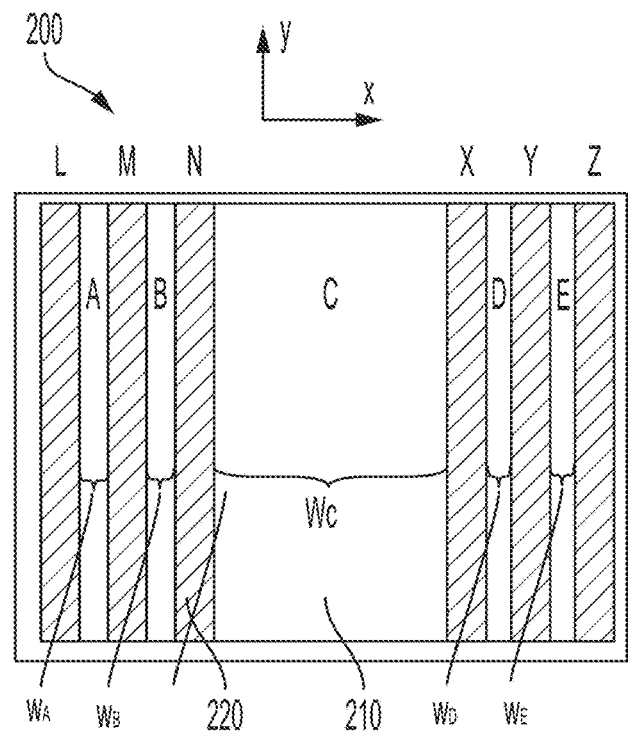
FIG. 2A is a schematic top-view diagram of an exemplary sensing element, in accordance with some embodiments.

FIG. 2A is a schematic top-view diagram of an exemplary sensing element 200, in accordance with some embodiments. As shown in FIG. 2A, electric contacts to a resistive film 210 is made by six electrodes 220, each bearing labels L, M, N, X, Y and Z, respectively. In FIG. 2A, electrodes 220 are shaped as thin strips that define regions of resistive film 210 between adjacent electrodes bearing labels A, B, C, D and E.

Figure 2B:
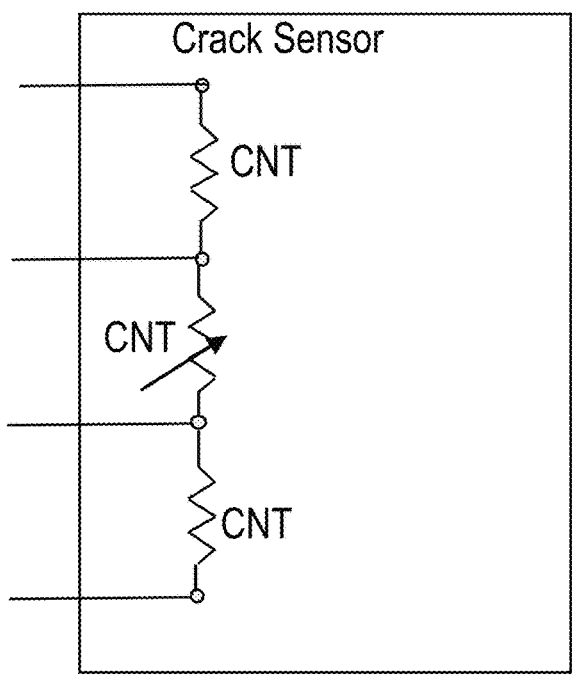
FIG. 2B is a schematic circuit diagram showing an equivalent circuit representing the sensing element shown in FIG. 2A.

FIG. 2B is a schematic circuit diagram showing an equivalent circuit representing the sensing element shown in FIG. 2A. Electrical resistance of a region may be measured and correlated to a physical property of a host material or structure, or to the environment of the host material or structure. For example, sensing element 200 may be a structural health monitor and region C of the sensing element 200 as shown in FIG. 2A may be a sensing portion attached to a structure and subject to the same physical constraints of the structure, such that a change in resistance in region C can be used to calculate a change of the structural property such as strain or occurrence of cracking. In some embodiments, resistance measurements of a region of sensing element 200 may be correlated to the degree of damage, the extent of a flaw or remaining useful life (RUL) of the host material or structure. In one non-limiting example, the resistance measurement of a region may be correlated to the length of a crack that has grown in a material.

Figure 3A:
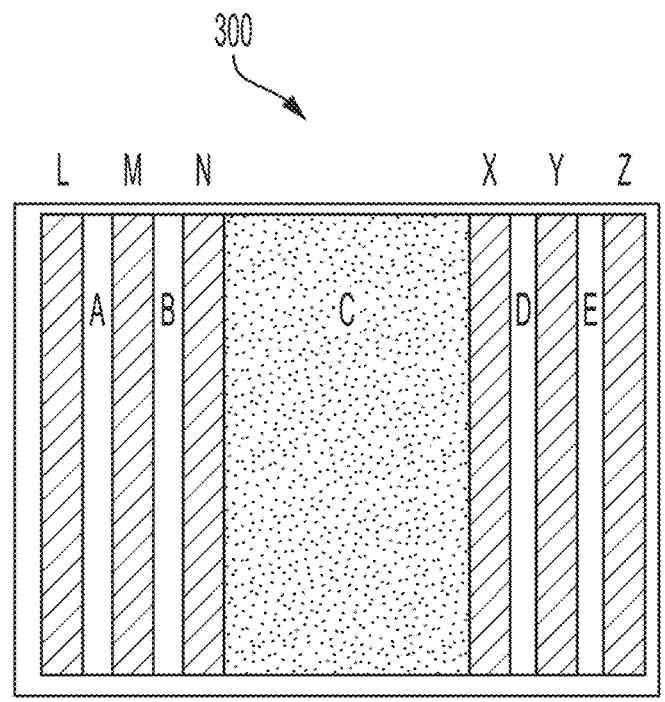
FIG. 3A is a schematic top-view diagram of an exemplary sensing element, in accordance with some embodiments.

FIG. 3A is a schematic top-view diagram of an exemplary sensing element 300, in accordance with some embodiments. Sensing element 300 is similar to sensing element 200 in FIG. 2A in many aspects, with like components marked with the same reference numbers.

Figure 3B:
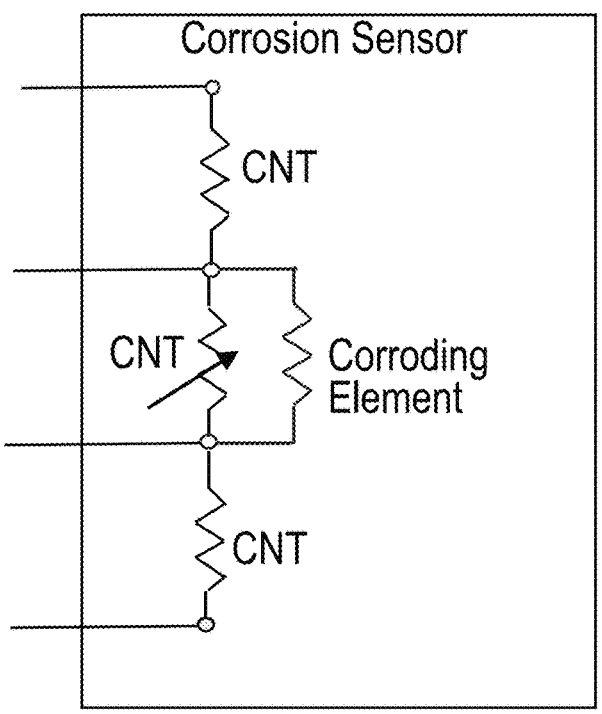
FIG. 3B is a schematic circuit diagram showing an equivalent circuit representing the sensing element shown in FIG. 3A.

FIG. 3B is a schematic circuit diagram showing an equivalent circuit representing the sensing element shown in FIG. 3A. Sensing element 300 may be a witness corrosion sensing element, where region C is coated with a corrosion sensitized material such as an electroplated Cu. In this embodiment, a measurement of resistance of region C (referred to below as $R_C$, and similarly for resistance of other regions labeled alphabetically) may be correlated to the degree of exposure of region C to a corrosive environment.

Referring back to FIG. 2A, in the embodiment that region C is a sensing portion that has a resistance representative of a sensed condition of a host material, another region that is not subject to the sensed condition may be a reference portion or reference region, whose resistance may be used to compensate for background drifts in the resistive film. For example, since regions B and C are part of the same resistive film, their resistance values are subject to the same material and/or manufacturing variability and proportional changes due to mechanical and/or environmental factors such as strain or temperature changes or aging across the entire resistive film. In some embodiments where properties of the resistive film 210 is not uniform across the X-Y plane, region B may be more preferably selected as a reference portion compared to for example region A, since region B is disposed closer in proximity to the sensing portion at region C, and therefore more accurately reflects the resistance of the underlying film material at region C.

The resistance values of a region may be defined and measured in any suitable ways. For example, a resistance value of region C may be a resistance in Ohms measured along the x-direction across the left extent and the right extent in between electrodes N and X. If the thickness and resistivity of resistive film 210 is substantially uniform across region C, then its resistance value may also be characterized using square resistance in Ohm/sq. Additionally, a calculated resistivity of region C may be used.

The inventors hare recognized and appreciated that when trying to measure resistance value of region C, a traditional approach of measuring the two-terminal resistance between electrode N and X in FIG. 2 will yield an overstated $R_{NX}=R_N+R_C+R_X$, where $R_C$ is the actual resistance of the resistive film at region C, $R_N$ and $R_X$ are contact resistances at the two contact points in between electrode N to the resistive film and between electrode X to the resistive film, respectively. $R_N$ and $R_C$ are unknown values that are not necessarily equal to each other. An aspect of the present application is directed to a method using multiple two-terminal resistance measurements at several select pairs of electrodes to extract a calibrated or compensated resistance value that is contact-resistance-independent, that is, without any contribution from contact resistance.

In FIG. 2A, the dimensions of the components such as the width in X- and Y-directions for electrodes 220 and regions A-E of the resistive film 210 can be selected in any suitable manner. FIG. 2A illustrates that each of the regions A-E has a respective width $W_A$, $W_B$ $W_C$, $W_D$, and $W_E$ along the X-direction, or along a direction of the current flow within the resistive film 210 during a sensing operation using the sensing element 200. In some embodiments, a sensor is provided, and the width of the compensation region is greater than the width of the side region. For example, in some embodiments, region C is used as a sensing portion, region B is used as a reference portion or compensation region, and its width $W_B$ is larger than the side region WA adjacent the outer boundaries of the resistive film 210. In a non-limiting example, $W_C$ is 12.5 mm, $W_B$ is 2.5 mm, $W_A$ is 1.5 mm, and each of $W_D$ and $W_E$ is 1.5 mm, although other dimensions may also be used. It should be appreciated that the same sizing considerations could be applied to the other figures showing the electrode layout (FIGS. 2C, 3A, 4A, 5A).

Figure 2C:
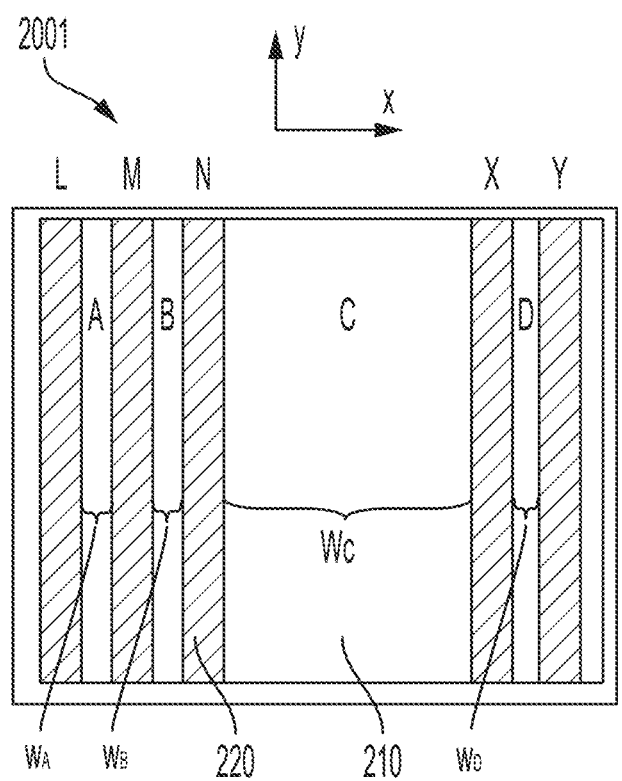
FIG. 2C is a schematic top-view diagram of an exemplary sensing element with five electrodes, in accordance with some embodiments.

FIG. 2C is a schematic top-view diagram of an exemplary sensing element 2001 with five electrodes, in accordance with some embodiments. Sensing element 2001 is similar to sensing element 200 in FIG. 2A in many aspects, with electrode Z removed such that only five electrodes are used on resistive film 210. In some embodiments, region C of sensing element 2001 may be used as a sensing portion, while region B used as a reference portion, as discussed above in relation with FIG. 2A. It should be appreciated that while other figures in this disclosure illustrate six electrodes on a resistive film, aspects of the present application do not require six electrodes and the examples illustrated throughout the application could be implemented in alternative embodiments with only five electrodes.

Figure 4A:
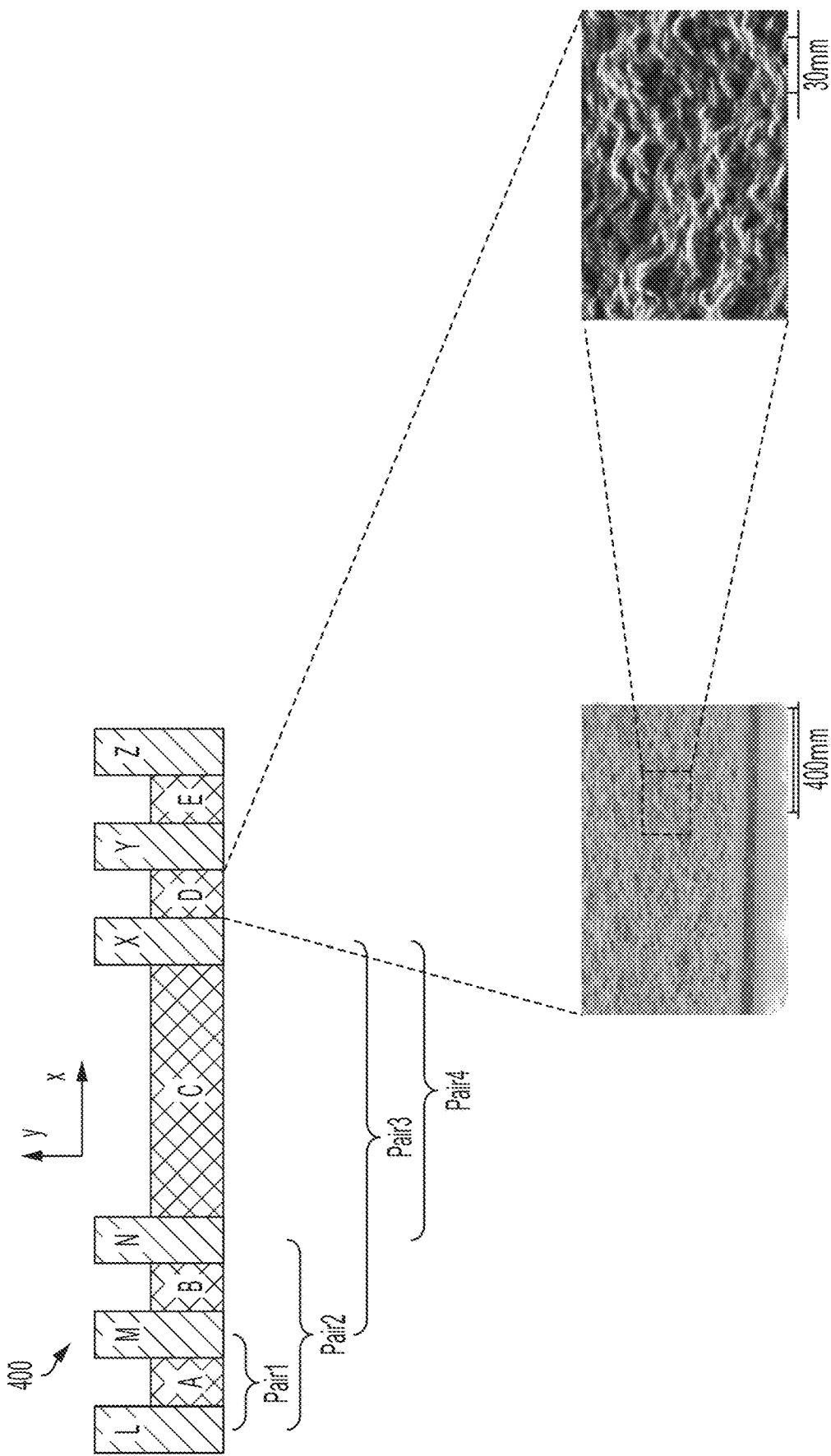
FIG. 4A is a schematic top view diagram of an exemplary PNC sensing element and several measurement configurations, in accordance with some embodiments.

FIG. 4A is a schematic top view diagram of an exemplary PNC sensing element 400 and several measurement configurations, in accordance with some embodiments. The inset to FIG. 4A shows two scanning electron microscopy (SEM) images of the surface of the PNC film at region D, which shows an un-uniform surface topography with peaks and valleys. In particular, the left panel of the SEM images shows CNT clustered on some area causing a non-uniform surface. The right panel of the SEM images shows peaks and valleys across the surface being imaged. The non-uniform surface topography is likely to generate a non-negligible amount of contact resistance between electrodes L, M, N, X, Y, Z with the PNC film, which can be compensated using the method described herein.

A two-terminal resistance could be measured between any combination of two electrodes using any suitable measurement device, such as the measurement module 16 in FIG. 1. The measurement can be made based on Ohm's law, for example by measuring the ratio of a static voltage applied across two electrodes versus a current flown through either one of the electrodes. FIG. 4A illustrates four possible permutations of electrode pairs for two-terminal resistance measurements Pair1, Pair2, Pair3 and Pair4.

FIG. 4B is a table illustrating an exemplary method using four two-terminal resistance measurements to obtain a contact-resistance-independent resistance of a region of the resistive film, in accordance with some embodiments. FIG. 4B shows that a resistance measured at pair 1 in FIG. 4A will be $R1=R_L+R_A+R_M$. The method proceeds to measure three more pairs of resistances to obtain $R2=R_L+R_A+R_B+R_N$; $R3=R_M+R_B+R_C+R_X$; $R4=R_N+R_C+R_X$. Using the four formula and by eliminating variables, one can find $R_B=(R2+R3-R1-R4)/2$. Therefore the reference resistor region B's contact-resistance-independent resistance can be obtained without the need to know the exact contact resistance of any electrode to resistive film contacts.

In the embodiment shown in FIG. 4A, region C of PNC sensing element 400 is exposed to the host material or structure. Therefore the contact-resistance-independent resistance $R_C$ is the test resistance R of the target that will change value based on the sensed condition. The contact-resistance-independent resistance for region C may be obtained after taking four two-terminal resistance measurements and combine the results to eliminate contact resistances, and compared to a baseline resistance for region.

According to an aspect of the present application, a baseline resistance Ro for region C may be created by averaging and normalizing $R_B$ using $Ro=R_B \times AF$, where AF is an area factor or geometric factor representing the geometric ratio between region C and region B.

Further according to an aspect, the contact-resistance-independent resistance for region C may be obtained after taking four two-terminal resistance measurements and combine the results to eliminate contact resistances.

Figure 5A:
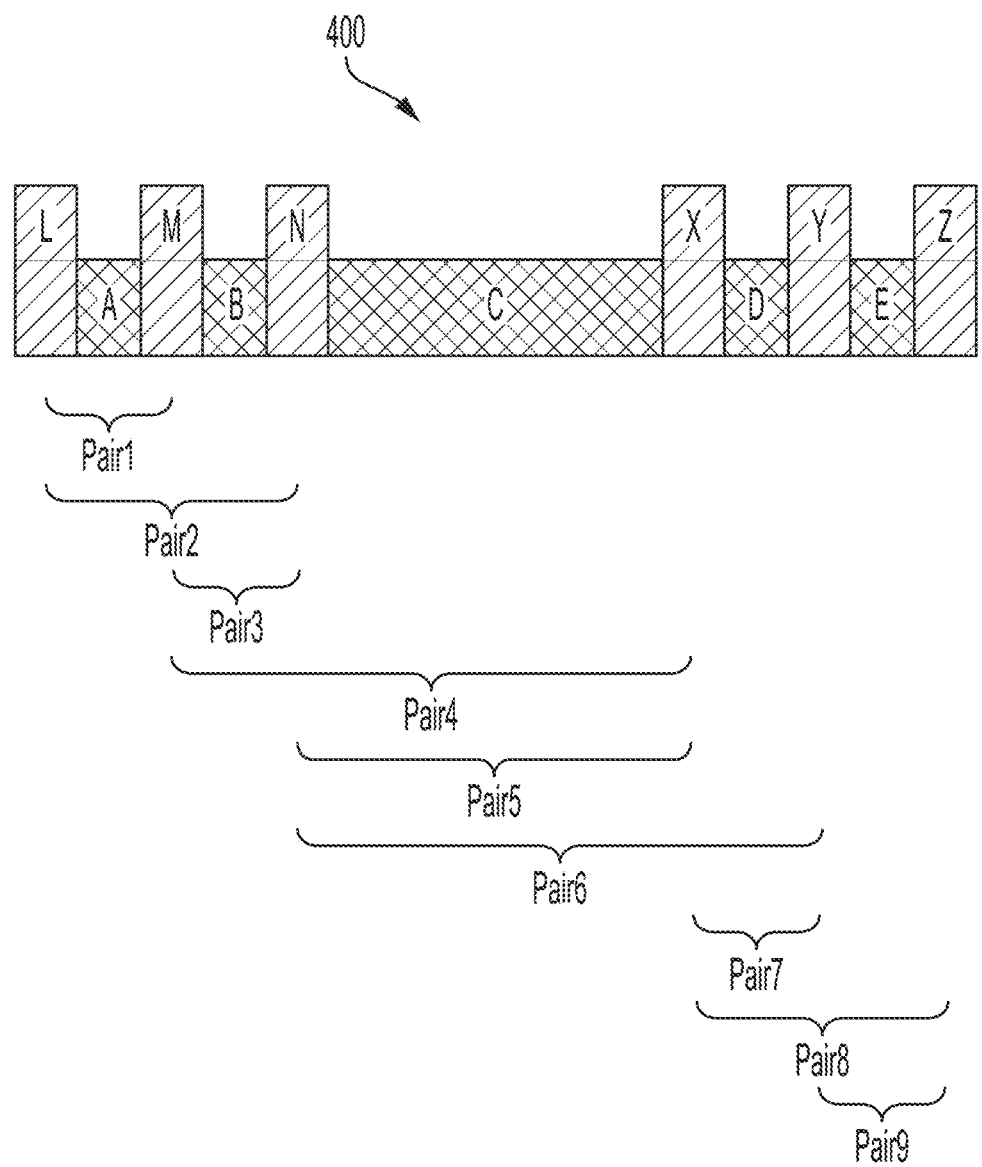
FIG. 5A is a schematic top view diagram of the exemplary PNC sensing element of FIG. 4A, with measurement configurations illustrating nine possible permutations of electrode pairs.

FIG. 5A is a schematic top view diagram of the exemplary PNC sensing element of FIG. 4A, with measurement configurations illustrating nine possible permutations of electrode pairs for two-terminal resistance measurements 1-9, and FIG. 5B is a table illustrating an exemplary method using four two-terminal resistance measurements to obtain a contact-resistance-independent resistance for several regions of the resistive film, in accordance with some embodiments.

FIG. 5B shows that the contact-resistance-independent resistance for region B can be obtained by $R_B=(R2+R4-R1-R5)/2$, the contact-resistance-independent resistance for region C can be obtained by $R_C=(R6+R8-R5-R9)/2$, and the contact-resistance-independent resistance for region D can be obtained by $R_D=(R4+R6-R3-R7)/2$.

In the particular example shown in FIG. 5A, region C of PNC sensing element 400 is exposed to the host material or structure. Therefore the contact-resistance-independent resistance $R_C$ is the test resistance R of the target that will change value based on the sensed condition. However, $R_C$ will also change due to the background drift intrinsic to the PNC film in sensing element 400. To calibrate $R_C$ to remove the background drift effect, $R_B$ and $R_D$, which are from regions B and D that do not vary according to the sensed condition, may be used as reference resistance values to compensate $R_C$.

According to an aspect of the present application, a baseline resistance Ro may be created by averaging and normalizing $R_B$ and $R_D$ using $Ro=(R_B+R_D) \times AF/2$, where AF is an area factor or geometric factor representing the geometric ratio between region C and region B or D. For example, if B has twice the length as C in the x-direction, it is expected that the baseline resistance for C will be twice that of B, and the area factor will be 2.0 to convert $R_B$ into $R_C$. If factors such as width, thickness, and/or resistivity are not identical for regions B and C, but ascertainable prior to the measurement, such factors may be determined during manufacturing of the sensing element and incorporated into AF as a scaling factor. Averaging two reference resistances $R_B$ and $R_D$ will reduce the effect of manufacturing variability of the PNC film across the x-direction, while no averaging or averaging of more than two reference resistances may also be used.

It should be appreciated that regions B and D need not be identical in size, and unique area factors $AF_B$ and $AF_D$ may be used for each to obtain the averaged and normalized baseline $Ro=(R_B \times AF_B + R_D \times AF_D)/2$.

In one non-limiting example, having obtained the baseline resistance Ro and the test resistance R for region C, a calibrated resistance may be obtained as $R/Ro=2R_C/AF \times (R_B+R_D)$ in one example. In this example, the calibrated or compensated resistance is a scaled value, and will be 100% if R is identical to the baseline Ro. Any change in R due to sensed condition will cause R/Ro to vary to represent the change in sensed condition. On the other hand, any background drift in resistance will be identically canceled out in R and in Ro, and will not affect R/Ro.

FIG. 5B also illustrates an exemplary calculation of an application of using the calibrated resistance to monitor cracking, when structural change in region C of the PNC film is reflective of cracks in a host material the sensor is attached to. In this example, a crack length parameter a can be calculated as a=sqrt(2R$_C$/AF×(R$_B$+R$_D$)−1)=sqrt(R/Ro−1).

Figure 6A:
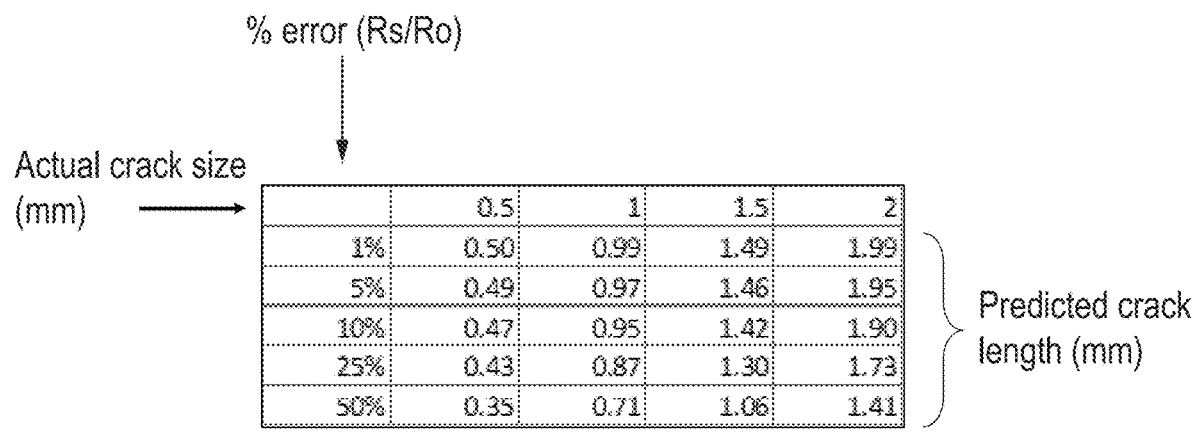
FIG. 6A is a table illustrating predicted crack length as a function of error in a test resistance R for four different given actual crack sizes.

FIG. 6A shows that for a given actual crack size, the higher the % error in R, the more deviation there is between the real crack size and the predicted crack length. As can be seen, for a 1% Rs, there is nearly no deviation, but by 10% the deviation starts to become large and the predicted crack length no longer accurately reflects actual crack length. To a first order, the relative error between predicted crack length and actual crack length is proportional to half of Rs/Ro, so if a parasitic resistance is 10% of the total resistance, there would be a 5% error in predicted crack length.

The predicted crack length values in FIG. 6A are calculated by assuming a 1 kOhm gauge and a 20 mm gain factor (GF), although such sensor configuration is but an example for illustration only and aspects of the present application are not so limited. GF may be defined by $$a = \sqrt{\left(\frac{R}{R_o} - 1\right)\left(\frac{2wL}{\pi}\right)} = 16\sqrt{R} = GF\sqrt{\frac{\Delta R}{R}},$$

where GF is the sensor geometry factor, and ΔR is the difference in measured resistance compared to baseline resistance, or change in resistance. This equation may be used to map ΔR/R from resistance to crack length. For Example, crack length $$a = 16\sqrt{\frac{\Delta R}{R}}.$$

Figure 6B:
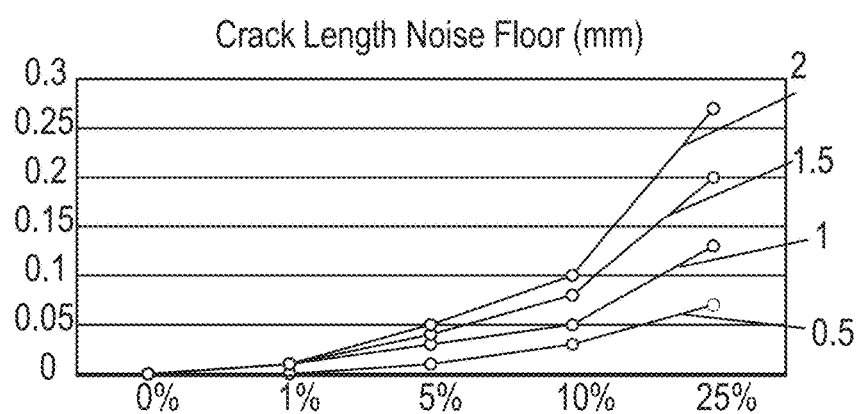
FIG. 6B is a data plot of predicted crack length noise floor in a sensor measurement versus measurement noise in percentage, for the four actual crack size summarized in the table in FIG. 6A.

FIG. 6B is a data plot of predicted crack length noise floor in a sensor measurement versus measurement noise in percentage, for the four actual crack size summarized in the table in FIG. 6A. Measurement noise, or ΔR/R, may represent a relative uncertainty in the measured resistance that introduces a systematic noise or uncertainty in predicted crack length. FIG. 6B illustrates such a correspondence, and shows that for a given actual crack size such as 1 mm, the higher the measurement noise, the higher the noise or uncertainty in the predicted crack length. The crack length noise may be referred to as a noise floor, because the predicted crack length will only be accurate to within a range of the noise floor around a baseline.

It should be appreciated that other forms of determining a and R may also be used. In some embodiments in which region C in FIG. 4A is used as the sensing portion, region D is used as the reference portion, a normalized test resistance R may also be calculated as $$R = \frac{R_C}{R_D} \cdot \frac{R_{D0}}{R_{C0}} - 1,$$

in which R$_C$ and R$_D$ are the contact-resistance-independent resistance of regions C and D, respectively, and R$_{C0}$ and R$_{D0}$ are the baseline resistance for the respective regions. Aspects of the present application may also be applied in other suitable forms to calculate the crack length parameter a based on R. For example, in some embodiments an equation for a is determined empirically. In some embodiments an equation for a comprises one or more polynomials of the normalized test resistance R. For example, empirical analysis of the crack length as a function of R may lead to identification of a polynomial relationship between the two. The identified relationship may be used in subsequent calculations of crack length as a function of R.

Figure 7:
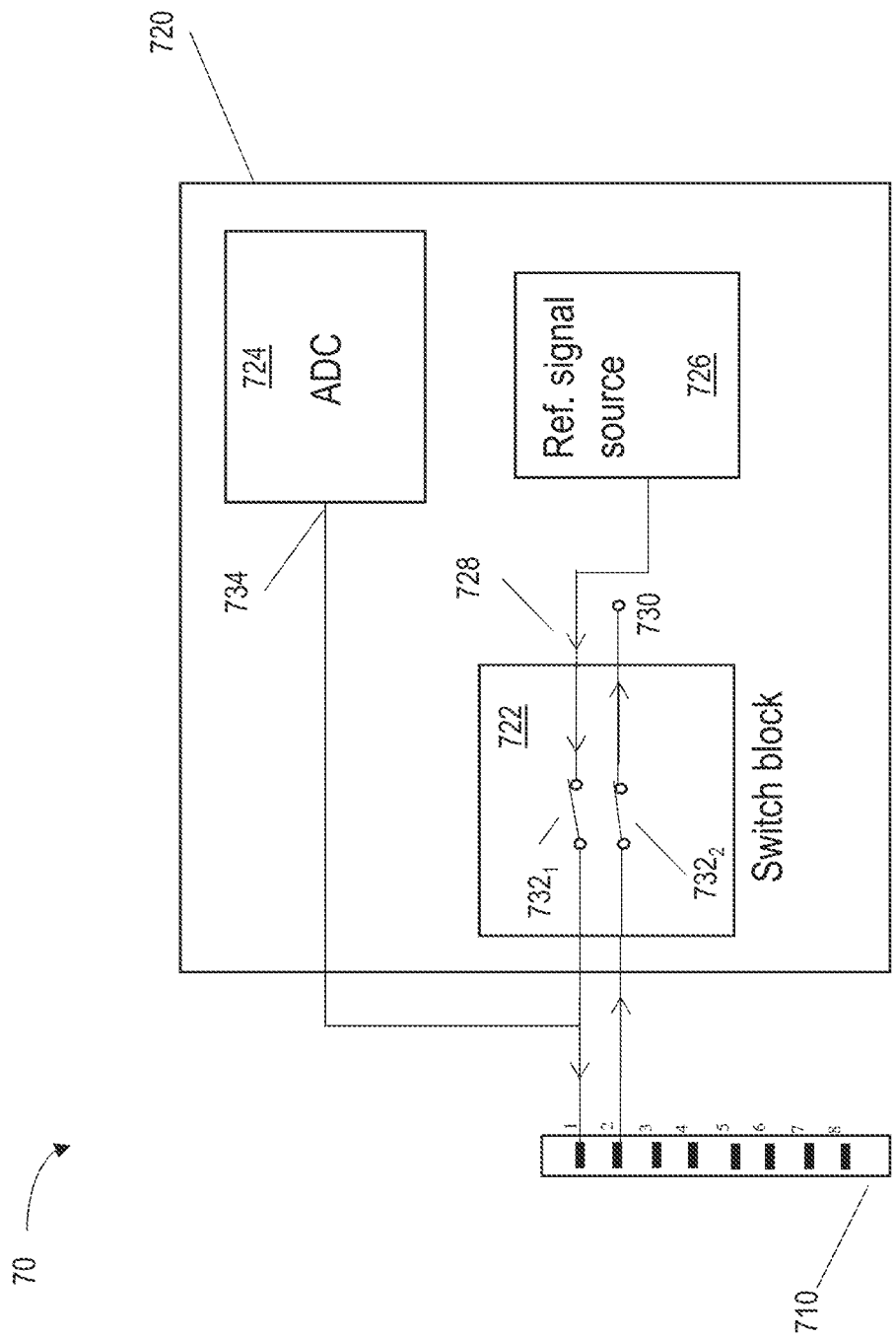
FIG. 7 is a schematic diagram of an exemplary sensor, in accordance with some embodiments.

FIG. 7 is a schematic diagram of an exemplary sensor, in accordance with some embodiments. FIG. 7 shows a sensor 70 that has a measurement module 720 coupled to a sensing element 710 that has a plurality of terminals 1, 2, . . . 8. Measurement module 720 includes ADC 724, a reference signal source 726 and a switch block 722. A current path 728 originates from reference signal source 726, through closed switch 732$_1$ within switch block 722 to a first terminal 1. The current path flows through a portion of the sensing element 710, through terminal 2, through a closed switch 732$_2$ to terminate at a reference voltage node 730 which can be ground. An input terminal 734 of ADC 724 is coupled directly to terminal 1 to digitize a voltage signal at terminal 1. By coupling directly to terminal 1, input terminal 734 is coupled to a point on the current path 728 that is outside of switch block 728, or between switch block 728 and terminal 1 of sensing element 710.

Figure 8:
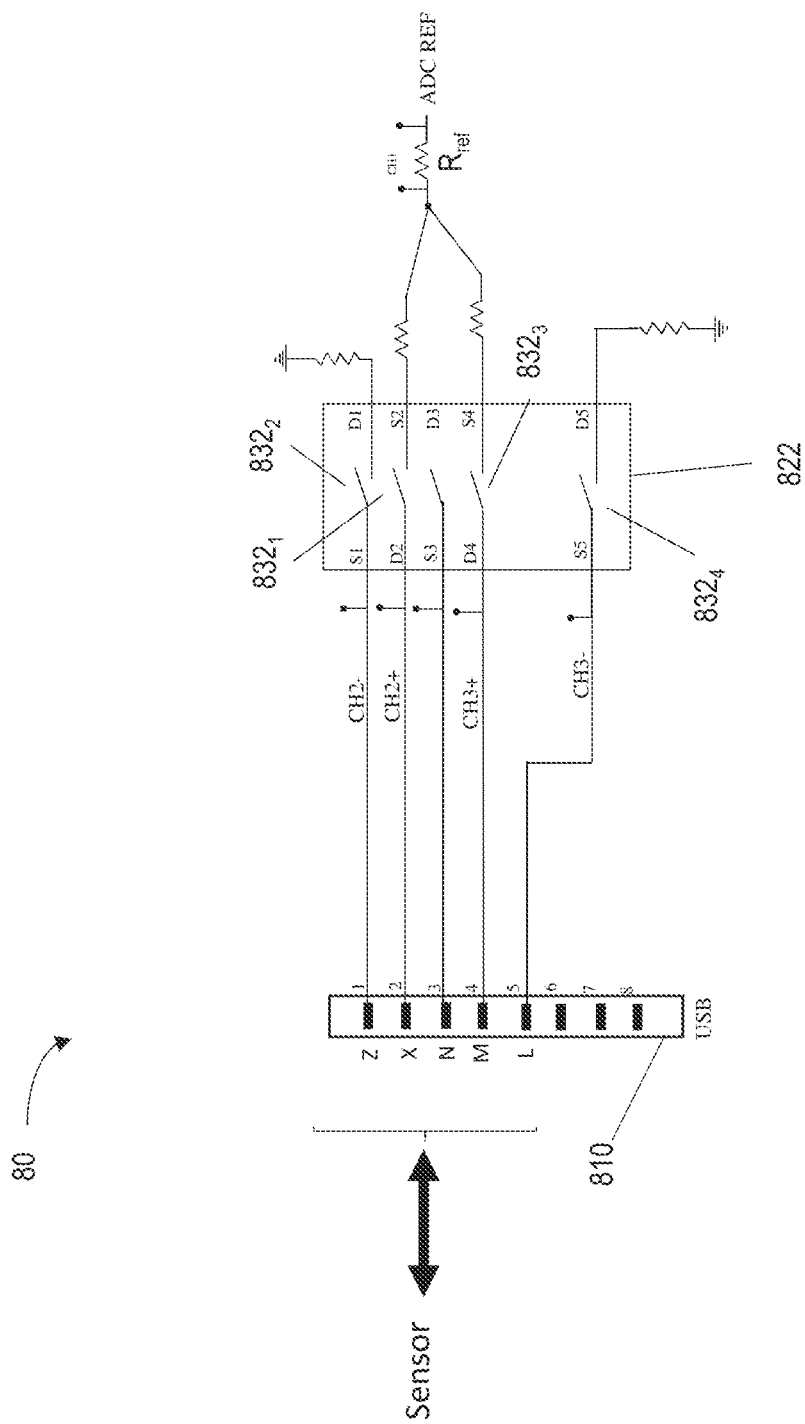
FIG. 8 is a schematic diagram of an exemplary sensor, in accordance with some embodiments.

FIG. 8 is a schematic diagram of an exemplary sensor, in accordance with some embodiments. FIG. 8 shows a sensor 80 that includes a switch block 823. When switches 832$_1$, 832$_2$ are closed within switch block 822, a first current path is formed from ADC REF, through R$_{ref}$ via terminals S2, D2, to terminal 2 to apply a stimulus at electrode X on sensing element 810. The first current path continues through electrode Z, terminal 1, to terminal S1, D1 of the switch block 822, and flows to ground. The first current path applies a current to resistance R$_{XZ}$ between electrodes X and Z of the sensing element. A voltage V across R$_{ref}$ may be measured, for example using inputs on the ADC, to calculate the current in the first current path I$_1$=V/R$_{ref}$. In this example, a voltage VC$_{CH2+}$ at terminal 2 is directly coupled to an input of the ADC such as ADC 734 of FIG. 7 to be digitized. V$_{CH2+}$ is relative to ground, and may be used in combination with I$_1$ to calculate R$_{XZ}$.

In some embodiments, rather than using a single-ended voltage V$_{CH2+}$ as voltage of R$_{XZ}$, another voltage V$_{CH2+}$ at terminal 1 is directly coupled to an input of the ADC to be digitized. The differential voltage V$_{CH2+}$-V$_{CD2-}$ may be used with I1 to more accurately calculate R$_{XZ}$, as V$_{CH2+}$ and V$_{CH2-}$ represent voltages at electrodes Z and X that are from free from voltage drops from the first current path flowing through parasitic resistance in the switch block 822.

Without wishing to be bound by a particular theory, parasitic resistance in the switch block 822 may be caused by voltage drop on one or more switches in the switch block. In some embodiments, the switches may be implemented as analog switches having an ON state resistance that may be a function of the drain-source voltage V$_{DS}$ and/or the power supply voltage V$_{DD}$. In such embodiments, not only will there be non-zero contribution to the parasitic resistance by ON state resistance in the switches, the ON state resistance values may also fluctuate depending on the values of V$_{DS}$, V$_{DD}$, further introducing noise or uncertainty in voltage drops across the switch block.

Still referring to FIG. 8, the same ADC REF may also be used to apply a current to measure resistance R$_{XL}$ between electrodes X and L of the sensing element when switches 832$_3$, 832$_4$ are closed within switch block 822. A second current path is formed from ADC REF, through $R_{ref}$ via terminal S2, D2, to terminal 2 to apply a stimulus at electrode X, then continues through electrode L, terminal 5, via terminals S5, D5 of the switch block 822, and flows to ground. The second current path applies a current to resistance $R_{XZ}$ between electrodes X and Z of the sensing element. A current $I_2$ in the second current path may be determined in the same way as I1 by monitoring a voltage across $R_{ref}$. In this example, a voltage $V_{CH3+}$ at terminal 5 is directly coupled to an input of the ADC to be digitized. $V_{CH3+}$ is relative to ground, and may be used in combination with an amplitude of $I_2$ to calculate $R_{XL}$.

Switch block 822 may and in a preferred embodiment does comprise more than two switches that can be controlled to switchably multiplex the ADC REF to measure any combinations of two-terminal resistances on sensing element 810.

Figure 9:
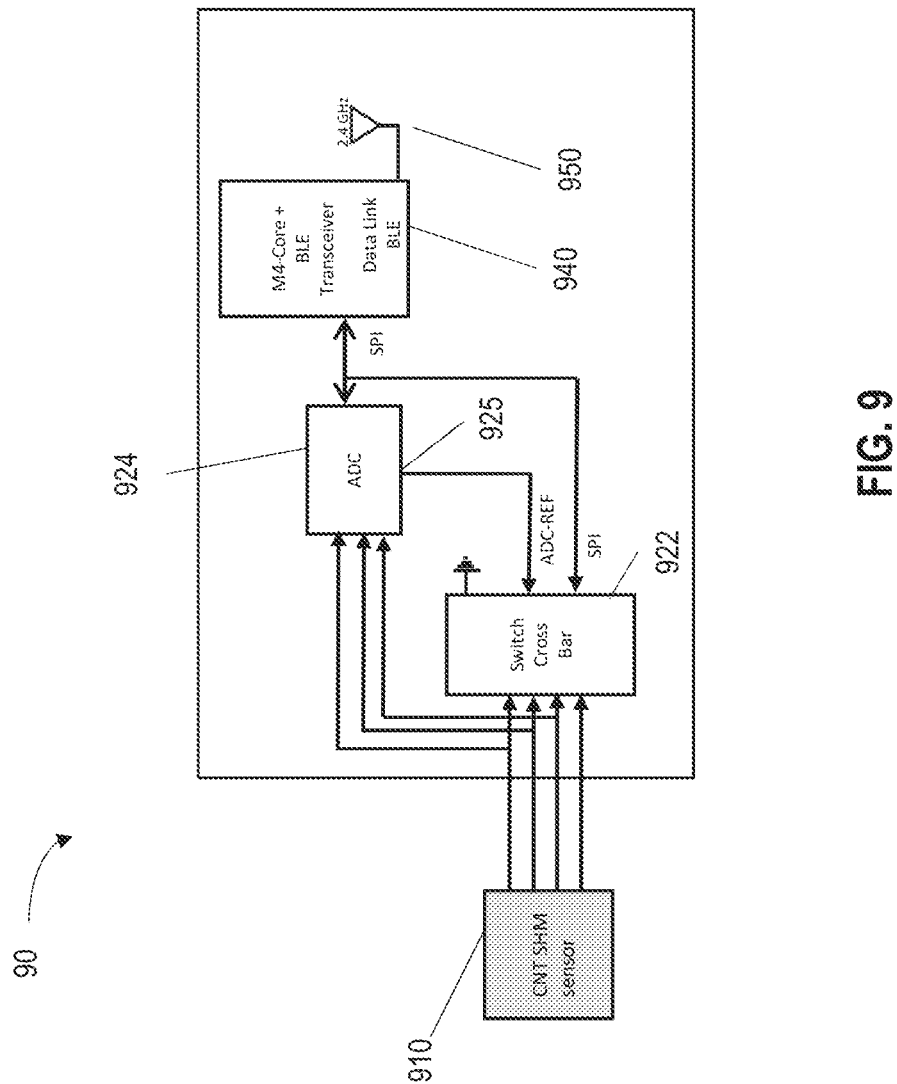
FIG. 9 is a schematic diagram of an exemplary sensor, in accordance with some embodiments.

FIG. 9 is a schematic diagram of an exemplary sensor, in accordance with some embodiments. FIG. 9 shows a sensor 90 in which the reference signal source ADC-REF is coupled to an output 925 of ADC 924. Sensor 90 also includes a processing unit 940 and antennas 950. A communication link SPI couples processing unit 940 with switch bar 922 and transmits control signals that cause switches within switch bar 922 to be selectively closed or opened to multiplex measurement on select terminals in sensing element 910.

Figure 10:
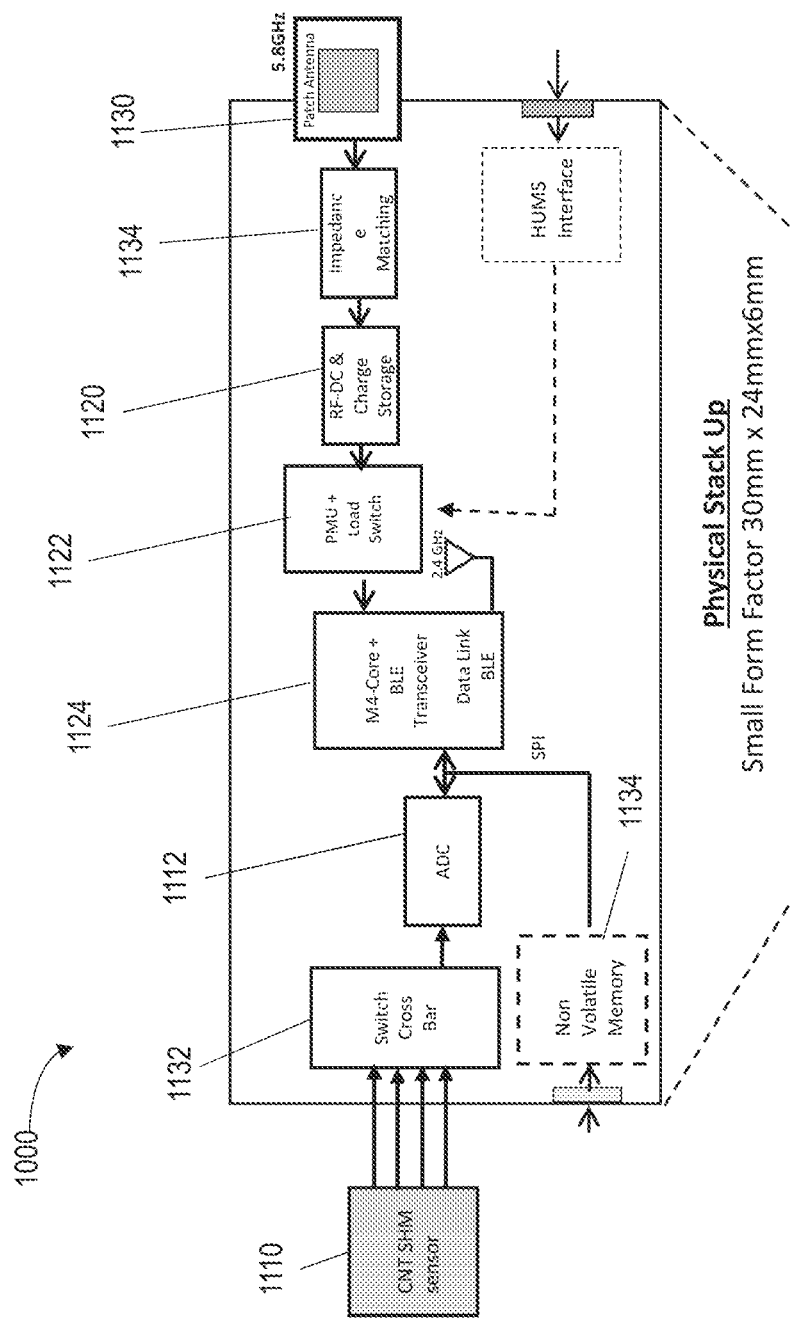
FIG. 10 is a schematic diagram illustrating an exemplary implementation of a wireless integrity sensing acquisition module with environmental compensation capabilities, in accordance with some embodiments.
Figure 10:
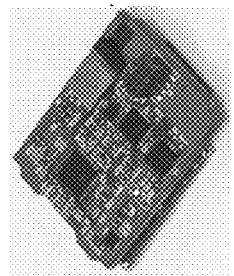

FIG. 10 is a schematic diagram illustrating an exemplary implementation of a wireless integrity sensing acquisition module with environmental compensation capabilities, in accordance with some embodiments. In FIG. 10, sensor 1000 is shown to comprise a patch antenna 1130, an impedance matching circuit 1134, an energy storage unit 1120, a power management unit (PMU) and load switch 1122, a controller 1124, ADC 1112, switch bar 1132, memory 1134, and a sensing element 1110. Sensing element 1110 may sense conditions which represent a permanent change in state of a structure, such as a state of corrosion or cracking. Some aspects of a wireless integrity sensing acquisition module of the type as shown in FIG. 10, and a reader for wirelessly reading from the sensing acquisition module are described in U.S. patent application Ser. No. 16/840,274, U.S. Application Publication No. 2021/0314871, filed on Apr. 3, 2020, and entitled "WIRELESS SENSOR READER WITH SOFTWARE-CONTROLLED POWER EXCITER AND METHOD FOR OPERATING THE SAME," the disclosure of which is hereby incorporated by reference in its entirety.

In addition to the foregoing, some novel aspects of the present application are summarized below.

In some embodiments, a wireless integrity sensing acquisition module is provided. The wireless integrity sensing acquisition module has an improved noise floor that can be achieved by taking multiple bias free resistance measurements through various combination of electrical breakout point pairs of a sensing element to account for material and/or manufacturing variability and changes due to mechanical and/or environmental factors such as strain or temperature changes or aging.

In some embodiments, a wireless integrity sensing acquisition module is provided. The wireless integrity sensing acquisition module has accurate compensation capabilities that can be achieved by taking multiple bias free resistance measurements through various combination of electrical breakout point pairs of a sensing element to account for material and/or manufacturing variability and changes due to mechanical and/or environmental factors such as strain or temperature changes or aging.

In some embodiments, the wireless integrity sensing acquisition module may have an ADC with signal conditioning circuit; a switch bar located out of the ADC measurement path to enable a bias free measurement of various combination of the sensor electrical breakout point pairs resistance; and a core with a transceiver to implement the wireless data link and compensation algorithm based on the collected measurements to account for the sensing element material and/or manufacturing variability and changes due to mechanical and/or environmental factors such as strain or temperature changes or aging.

In some embodiments, a passive version of the wireless integrity sensing acquisition module with accurate compensation capability is provided. In such embodiments, the wireless integrity sensing acquisition module further comprises an energy harvester to power the module.

In some embodiments, the switch bar is located out of the ADC measurement path to remove the switch bar resistance match between the various resistance data paths to optimize the measurement error.

In some embodiments, the switch bar is located out of the ADC measurement path to remove the switch bar resistance viability due to environmental temperature change and switch on Resistance Flatness match between the various resistance data paths to optimize the measurement error.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. An apparatus for measuring a resistance of a variable resistance sensor having a plurality of terminals, the apparatus comprising:
a switch block configured to:
selectably couple a reference signal source to a first terminal of the plurality of terminals of the variable resistance sensor; and
selectably couple a second terminal of the plurality of terminals of the variable resistance sensor to a reference voltage node, such that a current path exists between the reference signal source to the first terminal via the switch block, and continues between the second terminal and the reference voltage node via the switch block; and
an analog-to-digital converter (ADC) coupled to the first terminal of the plurality of terminals and configured to digitize a voltage present at the first terminal of the plurality of terminals.

2. The apparatus of claim 1, wherein the reference signal source is an output of the ADC.

3. The apparatus of claim 1, wherein the ADC is coupled to the second terminal and configured to digitize a voltage present at the second terminal.

4. The apparatus of claim 3, wherein the current path is configured to pass through a portion of the variable resistance sensor between the first terminal and second terminal.

5. The apparatus of claim 1, further comprising a reference resistor in the current path and connected between the reference signal source and the first terminal.

6. The apparatus of claim 5, wherein the ADC is coupled to the reference resistor and configured to digitize a voltage across the reference resistor.

7. A sensing apparatus for measuring a parameter of a variable resistance sensor having a plurality of terminals, the sensing apparatus comprising:
an analog-to-digital converter (ADC);
a switch block;
a reference signal source; and
a current path between the reference signal source and a first terminal of the plurality of terminals of the sensor via the switch block, wherein the current path continues to a reference voltage node via the switch block, wherein
the ADC is coupled to the first terminal and configured to digitize a voltage present at the first terminal,
the switch block is located outside of the measurement path, and
the switch block is configured to selectively couple a second terminal of the plurality of terminals of the variable resistance sensor to the reference voltage node.

8. The sensing apparatus of claim 7, wherein the reference signal source is an output of the ADC.

9. The sensing apparatus of claim 7, wherein the ADC is coupled to the second terminal and configured to digitize a voltage present at the second terminal.

10. The sensing apparatus of claim 9, wherein the current path is configured to pass through a portion of the variable resistance sensor between the first terminal and second terminal.

11. The sensing apparatus of claim 7, further comprising a reference resistor in the current path and connected between the reference signal source and the first terminal.

12. The sensing apparatus of claim 11, wherein the ADC is coupled to the reference resistor and configured to digitize a voltage across the reference resistor.

13. A method to measure a parameter of a sensor having a plurality of terminals, the method comprising:
closing a first switch in a switch block such that a reference signal source is coupled with a first terminal of the plurality of terminals of the sensor;
digitizing, with an analog-to-digital converter (ADC), a voltage present at the first terminal in response to a reference voltage signal at the reference signal source by coupling the voltage present at the first terminal directly to the ADC directly; and
closing a second switch in the switch block such that a second terminal of the plurality of terminals of the sensor is coupled with a reference voltage node, whereby a current path exists between the reference signal source to the first terminal via the switch block, and continues between the second terminal and the reference voltage node via the switch block.

14. The method of claim 13, wherein the reference signal source is an output of the ADC.

15. The method of claim 13, further comprising:
passing a current along the current path through a portion of the sensor between the first terminal and second terminal.

16. The method of claim 15, wherein the parameter of the sensor is a resistance of the portion of the sensor between the first terminal and second terminal, and the method further comprises:
calculating, with one or more processors, the parameter of the sensor based on the digitized voltage present at the first terminal and an amplitude of the current.

17. The method of claim 16, further comprising:
digitizing, with the ADC, a voltage present at the second terminal, and wherein calculating the parameter of the sensor is further based on the digitized voltage present at the second terminal.

18. A method to measure a resistance of a sensor having a plurality of terminals, the method comprising:
coupling a reference signal source to a first terminal of the plurality of terminals via a switch block;
coupling a ground node to a second terminal of the plurality of terminals via the switch block;
passing a current along a current path from the reference signal source, through the switch block, through a portion of the sensor between the first terminal and second terminal, and to the ground node;
coupling an analog-to-digital converter (ADC) to the first terminal via a measurement path that bypasses the switch block;
digitizing, with the ADC, a first voltage present at the first terminal and a second voltage present at the second terminal in response to a bias voltage at the reference signal source; and
calculating, with one or more processors, the resistance of the sensor based on a difference between the first and second voltages and an amplitude of the current.

19. A wireless integrity sensing acquisition module, comprising:
a resistive sensing element attached to a structure, the resistive sensing element having a resistance, and comprising a plurality of terminals;
a measurement module coupled to the plurality of terminals and configured to calculate a structural integrity parameter of the structure; and
a wireless communication module configured to transmit a signal representing the structural integrity parameter to a wireless reader, wherein
the measurement module comprises:
an analog-to-digital converter (ADC);
a switch block;
a reference signal source;
a current path between the reference signal source and a first terminal of the plurality of terminals of the resistive sensing element via the switch block, wherein the current path continues to a reference voltage node via the switch block, wherein
the ADC is coupled to the first terminal and configured to digitize a voltage present at the first terminal; and
a processor configured to calculate a target resistance of the resistive sensing element based on the digitized voltage and a current in the current path, and to calculate the structural integrity parameter based on the target resistance.

20. The wireless integrity sensing acquisition module of claim 19, wherein the structural integrity parameter is a crack length, and wherein the structure is a part of an aircraft.

* * * * *

UNITED STATES PATENT AND TRADEMARK OFFICE
CERTIFICATE OF CORRECTION

| | |
|---|---|
| PATENT NO. | : 12,044,715 B2 |
| APPLICATION NO. | : 17/511065 |
| DATED | : July 23, 2024 |
| INVENTOR(S) | : Yosef Stein et al. |

It is certified that error appears in the above-identified patent and that said Letters Patent is hereby corrected as shown below:

In the Claims

At Column 12, Line 50:
"an analog-to-digital converter (ADC) coupled to"
Should read:
--an analog-to-digital converter (ADC) coupled directly to--

At Column 13, Line 12:
"the ADC is coupled to the first terminal and"
Should read:
--the ADC is coupled to the first terminal via a measurement path and--

At Column 13, Line 16:
"the switch block is configured to selectively couple"
Should read:
--the switch block is configured to selectably couple--

At Column 14, Line 49:
"the ADC is coupled to the first terminal and"
Should read:
--the ADC is coupled to the first terminal via a measurement path that is outside of the switch block and--

Signed and Sealed this
Third Day of September, 2024

Katherine Kelly Vidal
*Director of the United States Patent and Trademark Office*